US012204246B2

United States Patent
Dai et al.

(10) Patent No.: US 12,204,246 B2
(45) Date of Patent: Jan. 21, 2025

(54) METAL OXIDE RESIST PATTERNING WITH ELECTRICAL FIELD GUIDED POST-EXPOSURE BAKE

(71) Applicant: Applied Materials, Inc., Santa Clara, CA (US)

(72) Inventors: Huixiong Dai, San Jose, CA (US); Mangesh Ashok Bangar, San Jose, CA (US); Srinivas D. Nemani, Sunnyvale, CA (US); Steven Hiloong Welch, Milpitas, CA (US); Ellie Y. Yieh, San Jose, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/342,176

(22) Filed: Jun. 8, 2021

(65) Prior Publication Data
US 2022/0390847 A1 Dec. 8, 2022

(51) Int. Cl.
*G03F 7/11* (2006.01)
*C23C 16/06* (2006.01)
(Continued)

(52) U.S. Cl.
CPC ............... *G03F 7/11* (2013.01); *C23C 16/06* (2013.01); *G03F 7/0045* (2013.01);
(Continued)

(58) Field of Classification Search
CPC .......... G03F 7/40; G03F 7/0047; G03F 7/162; G03F 7/20; G03F 7/0042; G03F 7/0043; G03F 7/36; C23C 16/06
See application file for complete search history.

(56) References Cited

U.S. PATENT DOCUMENTS 9,366,966 B2 * 6/2016 Xie .................. G03F 7/0045
9,377,692 B2 * 6/2016 Xie .................. B82Y 10/00
(Continued)

FOREIGN PATENT DOCUMENTS

JP 2005537507 A 12/2005
JP 2006032605 A 2/2006
(Continued)

OTHER PUBLICATIONS

Needham et al., "Calibration of a MOx-specific EUV photoresist lithography model," Proc. SPIE 11323, Extreme Ultraviolet (EUV) Lithography XI, 113230G (Mar. 23, 2020) (Year: 2020).*
(Continued)

*Primary Examiner* — Mark F. Huff
*Assistant Examiner* — Moriah S. Smoot
(74) *Attorney, Agent, or Firm* — Patterson + Sheridan, LLP (57) ABSTRACT

A method for processing a substrate is described. The method includes forming a metal containing resist layer onto a substrate, patterning the metal containing resist layer, and performing a post exposure bake on the metal containing resist layer. The post exposure bake on the metal containing resist layer is a field guided post exposure bake operation and includes the use of an electric field to guide the ions or charged species within the metal containing resist layer. The field guided post exposure bake operation may be paired with a post development field guided bake operation.

22 Claims, 5 Drawing Sheets

(51) Int. Cl.

| | | |
|---|---|---|
| *G03F 7/004* | (2006.01) | |
| *G03F 7/038* | (2006.01) | |
| *G03F 7/16* | (2006.01) | |
| *G03F 7/32* | (2006.01) | |
| *G03F 7/38* | (2006.01) | |
| *G03F 7/40* | (2006.01) | |

(52) U.S. Cl.
CPC .......... *G03F 7/0047* (2013.01); *G03F 7/0382* (2013.01); *G03F 7/162* (2013.01); *G03F 7/167* (2013.01); *G03F 7/168* (2013.01); *G03F 7/325* (2013.01); *G03F 7/38* (2013.01); *G03F 7/40* (2013.01)

(56) References Cited

U.S. PATENT DOCUMENTS

| | | |
|---|---|---|
| 2008/0044595 A1 | 2/2008 | Thakur et al. |
| 2015/0355549 A1 | 12/2015 | Xie et al. |
| 2018/0046085 A1* | 2/2018 | Godet ........................ G03F 7/38 |
| 2018/0107117 A1* | 4/2018 | Ouyang ................ G03F 7/2041 |
| 2019/0384171 A1 | 12/2019 | Zi et al. |
| 2020/0233307 A1* | 7/2020 | Dai ........................... G03F 7/38 |
| 2021/0013034 A1 | 1/2021 | Wu et al. |
| 2021/0041785 A1* | 2/2021 | Dai ........................... G03F 7/38 |
| 2021/0157233 A1 | 5/2021 | Zi et al. |
| 2021/0294215 A1* | 9/2021 | Dai ......................... G03F 7/094 |
| 2021/0294216 A1* | 9/2021 | Dai ........................... G03F 7/38 |

FOREIGN PATENT DOCUMENTS

| | | | | | |
|---|---|---|---|---|---|
| JP | 2015157807 | A | | 9/2015 | |
| JP | 2017034233 | A | | 2/2017 | |
| TW | 201614388 | A | | 4/2016 | |
| TW | 202001420 | A | | 1/2020 | |
| TW | 202028879 | A | | 8/2020 | |
| TW | 202115509 | A | | 4/2021 | |
| WO | WO-2018004646 | A1 | * | 1/2018 | |
| WO | 2019217749 | A1 | | 11/2019 | |
| WO | WO-2020102085 | A1 | * | 5/2020 | ........... G03F 7/0042 |
| WO | WO-2020132281 | A1 | * | 6/2020 | ............. G03F 7/162 |
| WO | WO-2020149903 | A1 | * | 7/2020 | ........... G03F 7/0752 |
| WO | WO-2020264556 | A1 | * | 12/2020 | ........... G03F 7/0043 |
| WO | 2021-089270 | A1 | | 5/2021 | |

OTHER PUBLICATIONS

Kasahara, Kazuki, et al. "Nanoparticle photoresist studies for EUV lithography." Extreme Ultraviolet (EUV) Lithography VIII. vol. 10143. SPIE, 2017. (Year: 2017).*
Ober, Christopher K., et al.—"EUV Photolithography: Resist Progress and Challenges," Extreme Ultraviolet (EUV) Lithography IX, edited by Kenneth A. Goldberg, Proceedings of SPIE vol. 10583, 1058306, Mar. 19, 2018, San Jose, California, 15 pages.
Grenville, Andrew, et al.—"Integrated Fab Process for Metal Oxide EUV Photoresist," Conference Paper, Feb. 2015, 9 pages.
Lu, Chaoyun, et al.—"Review of recent advances in inorganic photoresists," RCS Advances, Royal Society of Chemistry, 2020, vol. 10, pp. 8385-8395.
Manouras, Theodore, et al.—"High Sensitivity Resists for EUV Lithography: A Review of Material Design Strategies and Performance Results," Nanomaterials 2020, 10, 1593, 24 pages.
Mas, Ruben, et al.—"Stochastics in extreme ultraviolet lithography: investigating the role of microscopic resist properties for metal oxide-based resists," Journal of Micro/Nanolithography, MEMS, and MOEMS, vol. 17(4), 041003, Oct.-Dec. 2018, 10 pages.
Stowers, Jason (INPRIA)—"Metal Oxide Photoresists: Breaking Paradigms in EUV Lithography," 2017 EUVL Workshop, 17 pages.
International Search Report and Written Opinion for International Application No. PCT/US2022/028084 dated Aug. 26, 2022.
Taiwan Office Action dated Jun. 18, 2024 for Application No. 111117444.
Japanese Office Action issued to Application No. 2023-574710 on Nov. 19, 2024 in 9 pages.

* cited by examiner

METAL OXIDE RESIST PATTERNING WITH ELECTRICAL FIELD GUIDED POST-EXPOSURE BAKE

BACKGROUND

Field

Embodiments of the present disclosure generally relate to methods and apparatus for processing a substrate. More specifically, the disclosure is directed towards methods and apparatus for enhancing metal oxide resist profile control.

Description of the Related Art

Integrated circuits have evolved into complex devices that can include millions of components (e.g., transistors, capacitors and resistors) on a single chip. Photolithography is a process that may be used to form components on a chip. Generally the process of photolithography involves a few basic stages. Initially, a photoresist layer is formed on a substrate. A chemically amplified photoresist typically includes a resist resin and a photoacid generator. The photoacid generator, upon exposure to electromagnetic radiation in a subsequent exposure stage, alters the solubility of the photoresist in the development process. The electromagnetic radiation may have any suitable wavelength, for example, a 193 nm ArF laser, extreme ultraviolet light (also known as EUV), or be an electron beam, an ion beam, or other suitable electromagnetic radiation source.

In the exposure stage, a photomask or reticle is used to selectively expose certain regions of the substrate to electromagnetic radiation. Other exposure methods include maskless exposure methods or the like. Exposure to light decomposes the photo acid generator, which generates acid and results in a latent acid image in the resist resin. After exposure, the substrate is heated in a post-exposure bake process. During the post-exposure bake process, the acid generated by the photoacid generator reacts with the resist resin, changing the solubility of the resist during the subsequent development process.

After the post-exposure bake, the substrate, particularly the photoresist layer, is developed and rinsed to create a patterned mask. Depending on the type of photoresist used, regions of the substrate that were exposed to electromagnetic radiation are either resistant to removal or more prone to removal. After development and rinsing, the pattern of the mask is transferred to the substrate using a wet or dry etch process.

The evolution of chip design continually pursues faster circuitry and greater circuit density. The demand for greater circuit density typically utilizes a reduction in the dimensions of the integrated circuit components. As the dimensions of the integrated circuit components are reduced, more elements are able to be placed in a given area on a semiconductor integrated circuit. Accordingly, lithography processes transfer even smaller features onto a substrate, and lithography does so precisely, accurately, and without damage to meet advanced chip design specifications. In order to precisely and accurately transfer features onto a substrate, high resolution lithography utilizes a light source that provides radiation at small wavelengths. Small wavelengths help to reduce the minimum printable size on a substrate or wafer. However, small wavelength lithography suffers from problems, such as low throughput, increased line edge roughness, decreased resist sensitivity, and/or increased nano pattern defectivity by line bridging/breaking.

Electrode assemblies are utilized to generate and deliver an electric field to a photoresist layer deposited on the substrate prior to or after an exposure process so as to modify chemical properties of a portion of the photoresist layer where the electromagnetic radiation is transmitted for improving lithography exposure/development resolution. However, there are difficulties in decreasing the printing size on the substrate using current photoresist materials and bake processes.

Therefore, there is a need for improved methods for resist patterning on a substrate.

SUMMARY

In one embodiment, a method of processing a film stack is described. The method includes forming a metal containing resist layer on a substrate, patterning the metal containing resist layer, and performing a post exposure bake process after patterning the metal containing resist layer. The metal containing resist layer is one of a metal doped resist layer or a metal oxide resist layer. Patterning the metal containing resist layer forms a plurality of unexposed portions of the metal containing resist layer and a plurality of exposed portions of the metal containing resist layer. The electric field is applied across the metal containing resist layer and perpendicular to a major plane of the substrate to treat the plurality of exposed portions of the metal containing resist layer.

In another embodiment, a method of processing a film stack includes forming a metal containing resist layer on a substrate, patterning the metal containing resist layer, and performing a post exposure bake process after patterning the metal containing resist layer. The metal containing resist layer includes metal nanoparticles or metal oxide nanoparticles. Patterning the metal containing resist layer forms a plurality of unexposed portions of the metal containing resist layer and a plurality of exposed portions of the metal containing resist layer. The post exposure bake process is performed by heating the substrate to about 150° C. to about 300° C. and applying a first electric field across the metal containing resist layer.

In yet another embodiment, a method of processing a substrate includes forming a metal containing resist layer on a substrate, baking the metal containing resist layer, patterning the baked metal containing resist layer, a post exposure bake process is performed after patterning the metal containing resist layer, the substrate is developed using a wet or dry development process after performing the post exposure bake process, and a post development bake is performed after developing the substrate. The metal containing resist layer includes metal oxide nanoparticles or metal nanoparticles. The baked metal containing resist layer is patterning to form a plurality of unexposed portions of the metal containing resist layer and a plurality of exposed portions of the metal containing resist layer. The post exposure bake process includes heating the substrate to about 80° C. to about 300° C. and applying a first electric field across the metal oxide resist layer perpendicular to a major plane of the substrate. The post development bake includes heating the substrate and applying a second electric field across the metal containing resist layer perpendicular to a major plane of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relate to methods and apparatus for enhancing metal oxide resist profile control. Methods and apparatus disclosed herein assist in reducing line edge/width roughness, reducing pattern bridging/breaking line defects and improving exposure resolution in a photolithography process for semiconductor processing applications.

Metal oxide photoresists enable smaller line spacing on a semiconductor substrate when compared to more traditional photoacid resists. Performing at least one field guided bake on the metal oxide photoresist has been shown to improve the edge smoothness, the material properties of lines formed on a substrate, and the dose sensitivity while reducing the line width roughness and providing a wider depth of focus process window while using metal oxide photoresists. The field guided bakes may be performed both before and after development of the substrate, such that a first field guided bake is a post exposure field guided bake while a second field guided bake is a post development field guided bake. Using both a first field guided bake and second field guided bake on the metal oxide photoresists further improves dose sensitivity and reduce line width roughness.

A "substrate" or "substrate surface," as described herein, generally refers to any substrate surface upon which processing is performed. Processing includes deposition, etching, and other methods utilized during semiconductor processing. For example, a substrate surface which may be processed includes silicon, silicon oxide, doped silicon, silicon germanium, germanium, gallium arsenide, glass, sapphire, and any other materials, such as metals, metal nitrides, metal alloys, and other conductive or semi-conductive materials, depending on the application. A substrate or substrate surface which may be processed also includes dielectric materials such as silicon dioxide, silicon nitride, organosilicates, and carbon doped silicon oxide or nitride materials. The substrate itself is not limited to any particular size or shape. Although the embodiments described herein are made with generally made with reference to a round 200 mm or 300 mm substrate, other shapes, such as polygonal, squared, rectangular, curved, or otherwise non-circular workpieces may be utilized according to the embodiments described herein.

Figure 1:
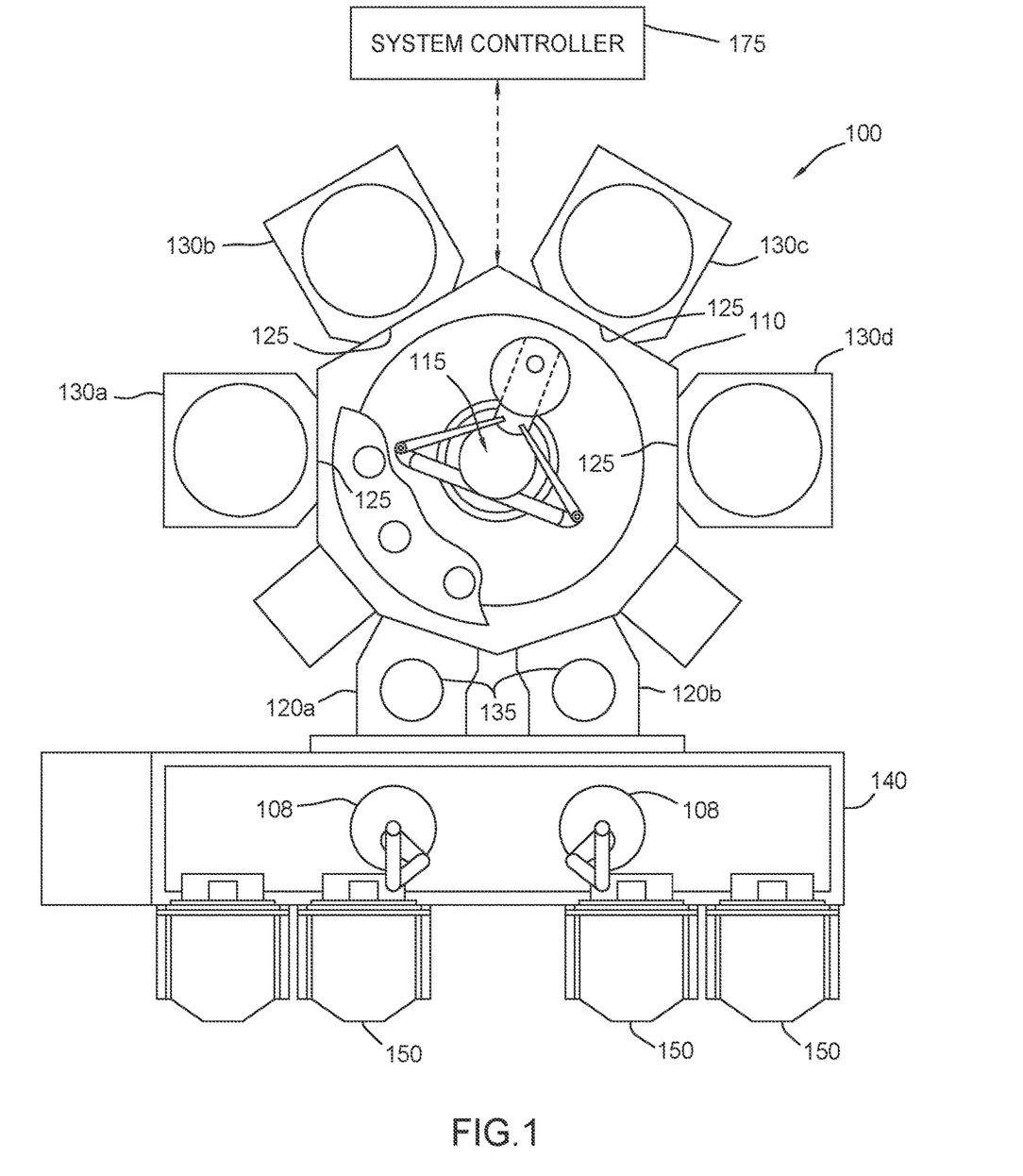
FIG. 1 illustrates a schematic plan view of a substrate processing system, according to one embodiment.

FIG. 1 illustrates a schematic plan view of a substrate processing system 100. The substrate processing system 100 is used to process semiconductor substrates by performing a variety of processes on the substrates. The substrate processing system 100 described herein includes a transfer chamber 110, a plurality of process chambers 130a-130d, load lock chambers 120a, 120b, and a factory interface (FI) 140. The FI 140 is shown interfaced with several front opening universal pods (FOUPs) 150. The process chambers 130a-d and the load lock chambers 120a, 120b are coupled to the transfer chamber 110. The transfer chamber 110 includes a robot 115 that moves substrates between the process chambers 130a-d and the load lock chambers 120a, 120b.

The load lock chambers 120a, 120b coupled between the FI 140 and transfer chamber 110. The FI 140 accepts the FOUPS 150 coupled thereto opposite the load lock chambers 120a, 120b. The load lock chambers 120a, 120b include a substrate support 135 disposed therein, which are used to facilitate substrate exchange with the robot 115 of the transfer chamber 110 and a robot 108 of the FI 140. The transfer chamber 110 includes a transfer robot 115 disposed therein. The substrate support 135 also holds the substrate when the lock chambers 120a, 120b are being pumped down to the vacuum level of the transfer chamber 110 or vented to the pressure (generally atmospheric) of the FI 140.

Each of the process chambers 130a-d includes a substrate transfer port 125 disposed adjacent to the transfer chamber 110 through which substrates enter or leave the process chambers 130a-d via the robot 115. The substrate transfer ports 125 may be sealable using a slit valve (not shown) to isolate the substrate disposed in each of the processing chambers 130a-d from the transfer chamber 110.

It is contemplated that the system 100 may have more or less processing chambers than the four process chambers 130a-d shown in FIG. 1. Additionally, the location of the process chambers 130a-d may be different than as shown. Although the system 100 illustrates the process chambers 130a-d coupled to the transfer chamber 110 in a cluster tool arrangement, the system 100 may alternatively have the process chambers 130a-d arranged be an in-line, batch, linear or other suitable manner. The process chambers 130a-d may be configured as etch chambers, lithographic exposure chambers, deposition chambers, or spin coating chambers, baking chambers, annealing chambers, or other type of semiconductor process chamber. Alternatively, the lithographic exposure chambers, the deposition chambers, and the bake chambers are positioned on separate tools and the substrate is transferred between the tools.

Figure 2:
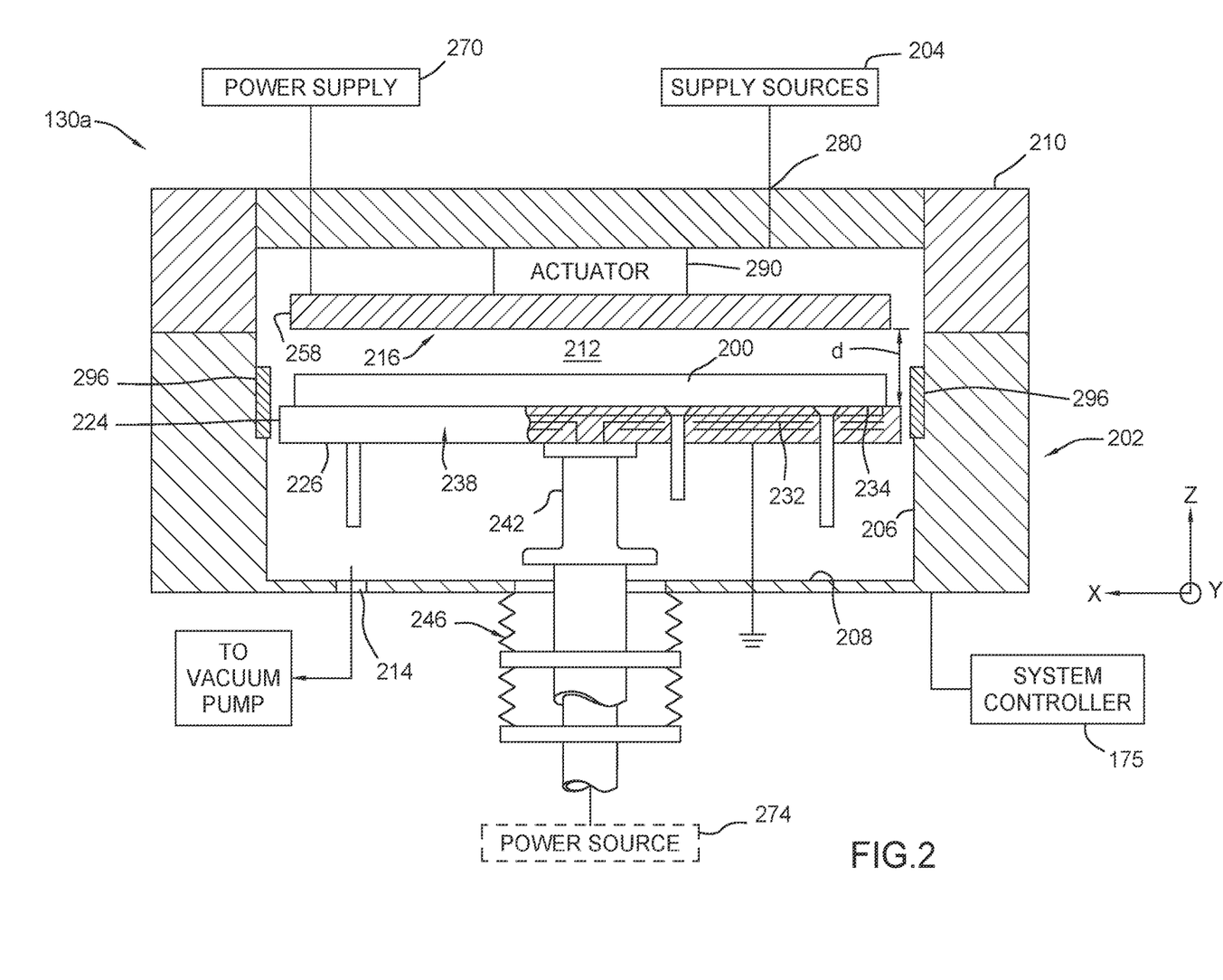
FIG. 2 illustrates a schematic cross-sectional view of a processing module within the substrate processing system of FIG. 1, according to one embodiment.

FIG. 2 illustrates a schematic cross-sectional view of the process chamber 130a of the substrate processing system 100 illustrated in FIG. 1. In some embodiments, the process chamber 130a may be an independent standalone processing chamber. The process chamber 130a is described in detail below and may be used for a pre-exposure bake, a post-exposure bake, and/or other processing steps.

The process chamber 130a includes chamber walls 202, an electrode assembly 216, and a substrate support assembly 238. The chamber walls 202 include sidewalls 206, a lid assembly 210, and a bottom 208. The chamber walls 202 partially enclose a process volume 212. The process volume 212 is accessed through the substrate transfer port 125 (shown in FIG. 1) configured to facilitate movement of the substrate 200 into and out of the process chamber 130a from the transfer chamber 110 by the robot 115.

A pumping port 214 may be disposed through one of the lid assembly 210, sidewalls 206 or bottom 208 of the process chamber 130a to couple the process volume 212 to an exhaust system. The exhaust system includes various vacuum pumping components, such as a vacuum pump, foreline, throttle valves and the like. The exhaust system is utilized to control the pressure within the process volume 212 and exhaust any gases and/or process by-products out of the process chamber 130a.

The process chamber 130a is coupled to one or more supply sources 204 for delivering one or more process gases into the process volume 212. In embodiments described herein, the supply source 204 is configured to supply an inert gas, such as argon (Ar), Helium (He), Xenon (XE), or Neon (He). The supply source 204 may also supply one of oxygen ($O_2$), or steam ($H_2O$).

The substrate support assembly 238 is centrally disposed within the process chamber 130a. The substrate support assembly 238 supports the substrate 200 during processing. The substrate support assembly 238 may include a body 224 that encapsulates at least one embedded heater 232. In some embodiments, the substrate support assembly 238 may be an electrostatic chuck. The heater 232, such as a resistive element, is disposed in the substrate support assembly 238. The heater 232 controllably heats the substrate support assembly 238 and the substrate 200 positioned thereon to a predetermined processing temperature. The heater 232 is configured to quickly ramp the temperature of the substrate 200 and to accurately control the temperature of the substrate 200. In some embodiments, the heater 232 is connected to a power source 274. The power source 274, and thus the temperature of the substrate 200, is controlled by the controller 175. The power source 274 may alternatively or additionally apply power to the substrate support assembly 238. The power source 274 may be configured similarly to a power source 270, discussed below. Furthermore, it is noted that the heater 232 may be disposed in other locations of the process chamber 130a, such as in the chamber wall, chamber liner, edge ring that circumscribes the substrate, the chamber ceiling and the like, as needed to provide thermal energy to the substrate 200 disposed on the substrate support assembly 238

Generally, the substrate support assembly 238 has a first surface 234 and a second surface 226. The first surface 234 is opposite the second surface 226. The first surface 234 is configured to support the substrate 200. The second surface 226 has a stem 242 coupled thereto. The substrate 200 may be any type of substrate, such as a dielectric substrate, a glass substrate, a semiconductor substrate, or a conductive substrate. The first surface 234 of the substrate support assembly 238 is separated from the electrode assembly 216 by a distance d in the z-direction. The stem 242 is coupled to a lift system (not shown) for moving the substrate support assembly 238 between an elevated processing position (as shown in FIG. 2) and a lowered substrate transfer position. The lift system may accurately and precisely control the position of the substrate support assembly 238 and substrate 200 disposed thereon in the z-direction. In some embodiments, the lift system may also be configured to move the substrate support assembly 238 and substrate 200 disposed thereon in the x-direction, the y-direction, or the x-direction and the y-direction. The stem 242 additionally provides a conduit for electrical and thermocouple leads between the substrate support assembly 238 and other components of the process chamber 130a. A bellows 246 is coupled to the substrate support assembly 238 to provide a vacuum seal between the process volume 212 and the atmosphere outside the process chamber 130a and facilitate movement of the substrate support assembly 238 in the z-direction.

The lid assembly 210 may optionally include an inlet 280 through which gases provided by supply sources 204 may enter the process chamber 130a. The supply sources 204 may optionally controllably pressurize the process volume 212 with a gas, such as nitrogen, argon, helium, other gases, or combinations thereof. The gases from the supply sources 204 may create a controlled environment within the process volume 212 of the process chamber 130a. The inlet 280 may also be located in other portions of the process chamber 130a. An actuator 290 may be optionally coupled between the lid assembly 210 and the electrode assembly 216. The actuator 290 is configured to move the electrode assembly 216 in one or more of the x, y, and z directions. The actuator 290 enables the distance d to be adjusted.

The electrode assembly 216 includes at least an electrode 258. As shown, the electrode 258 is coupled to the power source 270. In some embodiments, the electrode 258 is coupled to a ground and the power source 274 that delivers power to the substrate support 238 is a bipolar power supply that switches between a positive and negative bias. The electrode assembly 216 is configured to generate an electric field perpendicular to the first surface 234 of the substrate support assembly 238. For example, the electrode assembly 216 may be configured to generate an electric field in the z or −z direction.

The power source 270 is configured to supply, for example, between about 1 V and about 100 kV to the electrode assembly 216, to generate an electric field having a strength between about 0.1 MV/m and about 100 MV/m. In some embodiments, the power source 274 may also be configured to provide power to the electrode assembly 216. In some embodiments, any or both of the power source 270 or the power source 274 are a pulsed direct current (DC) power supply. The pulsed DC wave may be from a half-wave rectifier or a full-wave rectifier. The AC/DC power may have a frequency of between about 1 Hz and 1 MHz. The duty cycle of the pulsed DC power may be from between about 5% and about 95%, such as between about 20% and about 60%. In some embodiments, the duty cycle of the pulsed DC power may be between about 20% and about 40%. In other embodiments, the duty cycle of the pulsed DC power may be about 60%. The rise and fall time of the pulsed DC power may be between about 1 ns and about 1000 ns, such as between about 10 ns and about 500 ns. In other embodiments, the rise and fall time of the pulsed DC power may be between about 10 ns and about 100 ns. In some embodiments, the rise and fall time of the pulsed DC power may be about 500 ns. In some embodiments, any or both of the power source 270 or the power source 274 are an alternating current (AC) power supply. The AC power supply may have a frequency of between about 1 Hz and 1 MHz. The AC power supply is configured to supply a peak value of about 1V to about 100 kV to the electrode assembly 216. In other embodiments, either or both of the power source 270 and the power source 274 are a DC power supply.

In some embodiments, the voltage or power provided by either or both of the power source 270 and the power source 274 may use an AC/DC offset. The AC/DC offset may be, for example, between about 0% and about 75% of the applied voltage, such as between about 5% and about 60% of the applied voltage. In some embodiments, the electrode 258 is negatively pulsed while the substrate support assembly 238 is also negatively pulsed. In these embodiments, power provided to the electrode 258 and the substrate support assembly 238 are synchronized, but offset in time. For example, the electrode 258 may be at the "one" power state while the substrate support assembly is at the "zero" power state, then the substrate support assembly 238 may be at the "one" power state while the electrode 258 is at the "zero" power state.

In some embodiments, one or more magnets 296 may be positioned in the process chamber 130a. In the embodiment shown in FIG. 1, the magnets 296 are coupled to the inside surface of the sidewalls 206. In other embodiments, the magnets 296 may be positioned in other locations within the process chamber 130a or outside the process chamber 130a. The magnets 296 may be, for example, permanent magnets or electromagnets. Representative permanent magnets include ceramic magnets and rare earth magnets. In embodiments where the magnets 296 include electromagnets, the magnets 296 may be coupled to a power source (not shown). The magnets 296 are configured to generate a magnetic field in a direction perpendicular or parallel to the direction of the electric field lines generated by the electrode assembly 216 at the first surface 234 of the substrate support assembly 238.

Figure 3A:
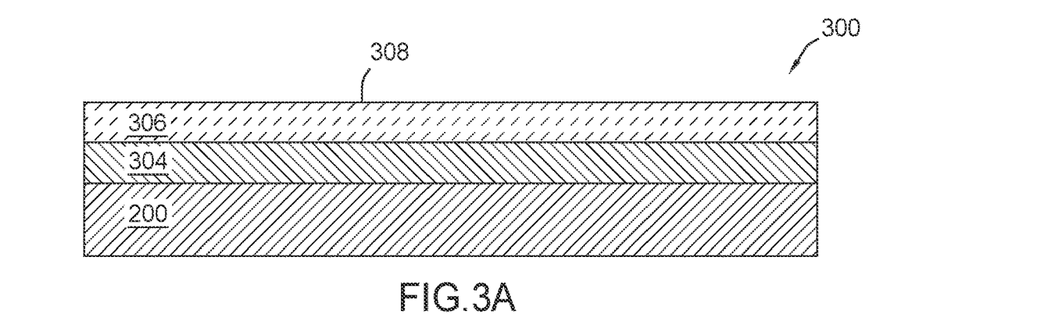
FIGS. 3A-3G are cross-sectional view of a film stack deposited on a substrate during different stages of substrate processing.

FIGS. 3A-3G are cross-sectional views of a film stack 300 deposited on the substrate 200 during different stages of a method 400 for forming a film stack. A flow diagram of the method 400 is illustrated in FIG. 4. At least a portion of the method 400 is performed in one or more of the process chambers 130a-d of FIG. 1, such as the process chamber 130a of FIG. 2. The method 400 is stored as instructions accessible by the memory of the controller 175. The controller 175 provides the instructions to at least one of the substrate processing system 100 and the process chamber 130a to perform the method 400. As shown in FIG. 3A, the film stack 300 deposited on the substrate 200 includes a device layer 304 deposited on top of the substrate 200, and an underlayer 306 deposited on top of the device layer 304. The device layer 304 may be one or more semiconductor devices and may include a plurality of layers or features therein. The underlayer 306 covers the device layer 304 and protects the device layer 304. The underlayer 306 is alternatively a hardmask layer in some embodiments. A top surface 308 of the underlayer 306 is a planar surface deposited on the opposite side of the underlayer 306 from the device layer 304.

The underlayer 306 includes one or more additives, such as acid agents, (e.g., photoacid generators (PAGs) or acid catalysts), base agents, adhesion promoters or photo-sensitive components. The one or more additives may be deposited in organic solvent or resin and/or an inorganic matrix material. Suitable examples of the acid agents including photoacid generators (PAGs) and/or acid catalysts may be selected from a group consisting of sulfonic acids (e.g., p-toluenesulfonic acid, styrene sulfonic acid), sulfonates (e.g., pyridinium p-toluenesulfonate, pyridinium trilluoromethanesulfonate, pyridinium 3-nitrobenzensulfonate), and mixtures thereof. Suitable organic solvent may include homo-polymers or higher polymers containing two or more repeating units and polymeric backbone. Suitable examples of the organic solvent include, but are not limited to, propylene glycol methyl ether acetate (PGMEA), ethyl lactate (EL), propylene glycol methyl ether (PGME), propylene glycol n-propyl ether (PnP), cyclohexanone, acetone, gamma butyrolactone (GBL), and mixtures thereof. The underlayer 306 may also be deposited using one of a chemical vapor deposition (CVD), physical vapor deposition (PVD), or atomic layer deposition (ALD) operations.

The underlayer 306 formed by one of the CVD, PVD, or ALD operations is similar in composition to the previously described underlayer 306.

In one example, the underlayer 306 provides active acid agents, base agents, electrons, ions, or ionic/non-ionic species during the lithographic exposure process, pre-exposure baking process, or post-exposure baking process.

In embodiments in which the underlayer 306 is a hardmask layer, the hardmask layer may be a spin-on or CVD/PVD/ALD deposited layer fabricated from a group consisting of silicon oxide, silicon nitride, silicon oxynitride, silicon carbide, amorphous carbon, doped amorphous carbon, TEOS oxide, USG, SOG, organic silicon, oxide containing material titanium nitride, titanium oxynitride, combinations thereof and the like.

Figure 3B:
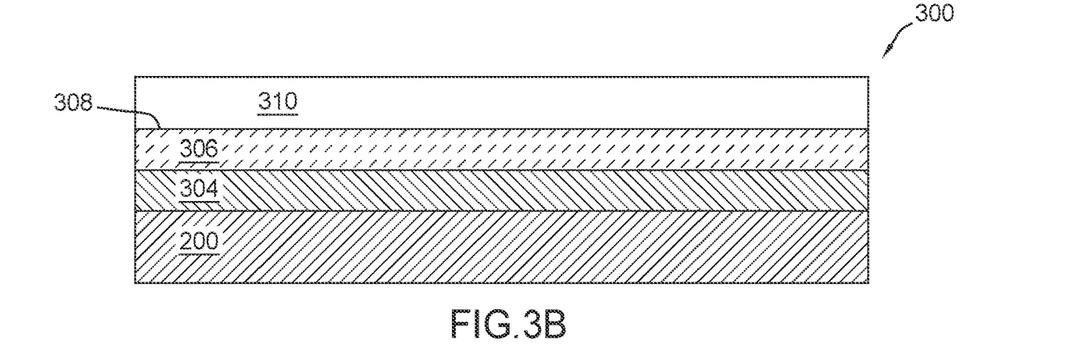
Figure 4:
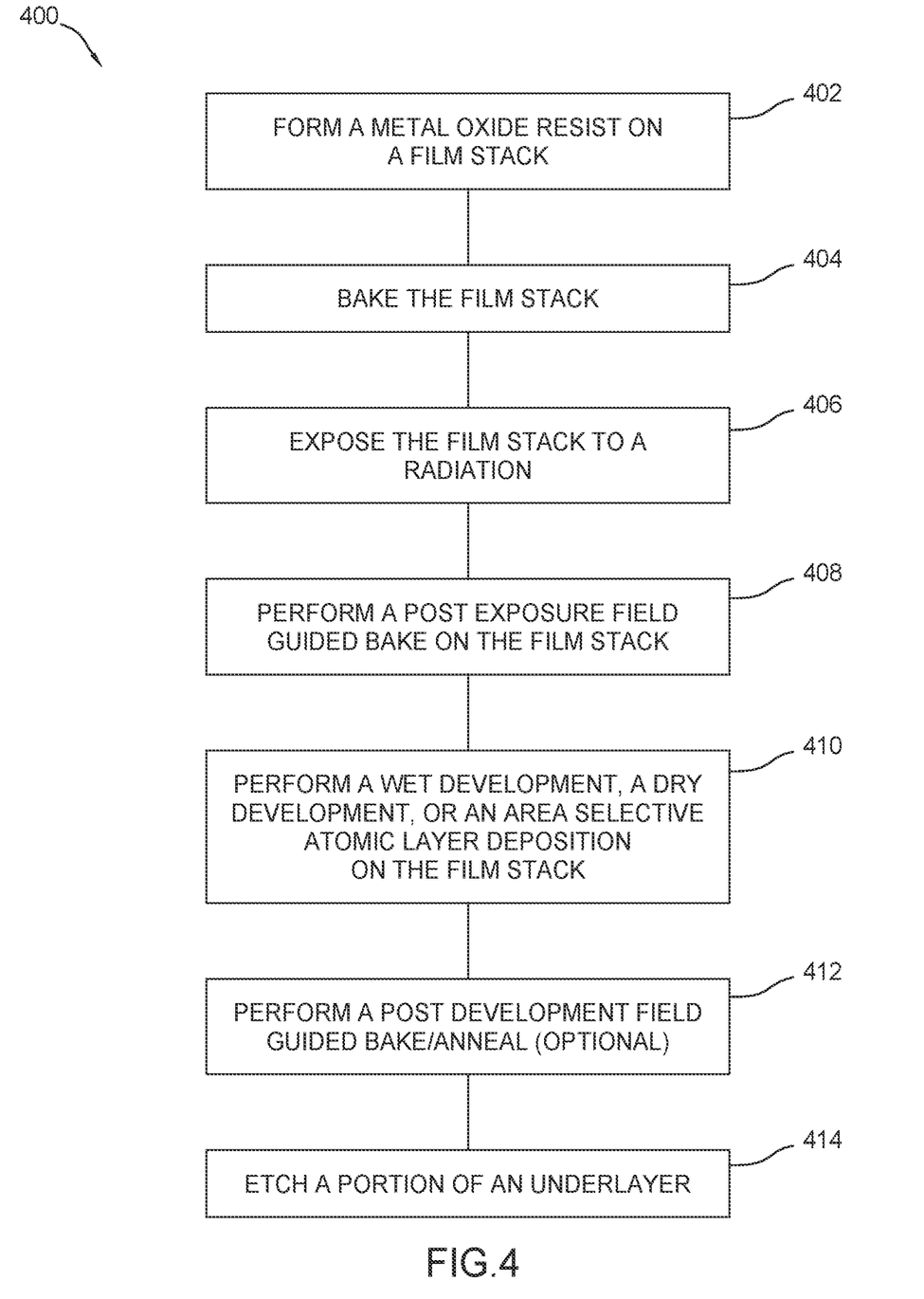
FIG. 4 is a flow diagram of a method of processing the film stack in accordance to the sequence illustrated in FIGS. 3A-3G.

The method 400 begins at operation 402 by depositing a metal containing resist layer 310 on the film stack 300, as illustrated in FIG. 3B. In one example, the metal containing resist layer 310 is deposited by spin coating. In another example, the metal containing resist layer 310 is deposited by a chemical vapor deposition (CVD) or an atomic layer deposition (ALD) process. The metal containing resist layer 310 is formed on the top surface 308 of the underlayer 306. The metal containing resist layer 310 is either a metal oxide resist layer or a metal doped resist layer. Then using a metal oxide resist layer, the metal containing resist layer 310 includes metal oxide nanoparticles and one or more ligands attached to the metal oxide nanoparticles. The metal oxide nanoparticles act as a core on which the ligands attach. The metal oxide and the ligands form a Lewis acid/Lewis base pair and associate with one another within the metal containing resist layer 310. The metal containing resist layer 310 may further comprise other materials, such as a polymer resist. In embodiments wherein the metal containing resist layer 310 is deposited by the CVD or ALD processes, the metal oxide nanoparticles and the attached ligands form substantially all of the metal containing resist layer 310.

In embodiments wherein the metal oxide nanoparticles and the ligands are deposited as a part of the metal containing resist layer 310 along with a polymer resist, the metal oxide nanoparticles and corresponding ligands within the metal containing resist layer 310 have a percent composition of the metal containing resist layer 310 of about 5% to about 30%, such as about 10% to about 25%, such as about 15% to about 25%. The metal oxide within the metal oxide resist layer 310 may be one or a combination of tin (IV) oxide ($SnO_2$), titanium dioxide ($TiO_2$), zirconium dioxide ($ZrO_2$), hafnium dioxide ($HfO_2$), indium (III) oxide ($In_2O_3$), or zinc oxide (ZnO). The metal oxides are formed as nanoparticles within the metal containing resist layer 310. The use of nanoparticles as the metal oxides allows better association of the metal oxide particles with the ligands and improves the results of subsequent field guided bake operations. The size of each metal oxide nanoparticle is less than about 25 nm wide, such as less than about 20 nm wide, such as less than about 15 nm wide, such as less than about 10 nm wide. The small size of each metal oxide nanoparticle assists in enabling better resolution during exposure and post exposure bake operations. Other metal oxides are also envisioned, but not disclosed herein.

The ligands within the metal containing resist layer 310 may be organic ligands, such as one or a combination of hydroxide (—OH), carbon monoxide (—CO), Nitrite (N—$O_2^1$), carbonate ($CO_3^{-2}$), or Oxalate $(COO)^{2-}_2$. Other ligands may also be utilized. Smaller ligands are utilized to improve resolution during the exposure and post exposure bake operations. The ligands and the metal oxide are chosen to enable controlled disassociation of the metal oxide nanoparticles and the ligands within portions of the metal containing resist layer 310 during a lithographic exposure and subsequent post exposure bake operations. The ligands and the metal oxide are additionally selected for their high absorption rate at Extreme Ultraviolet wavelengths.

When the metal containing resist layer is spin coated onto the film stack 300 during the operation 402 of the method 400, the metal oxide and the ligands are deposited as a resin or disposed within a separate resin or solution. The film stack 300 may be either dipped in the resin or solution or a stream of the resin or solution is distributed onto the top surface 308 of the underlayer 306 while the film stack 300 is spun about a central axis. This spreads the resin or solution along the top surface of the film stack 300.

In embodiments in which the metal containing resist layer 310 is deposited using chemical vapor deposition (CVD) or atomic layer deposition (ALD) during the operation 402 of method 400, the metal oxide and the ligands may be deposited by introducing a first precursor which contains the metal oxide and a second precursor which contains the ligands. The precursor streams of the first precursor and the second precursors may mix to form a metal-oxide material or an organometallic material. The mixing of the first precursor and the second precursor is performed concurrently with the deposition of the metal oxide resist layer 310.

In some embodiments, the metal containing resist layer 310 is a resist layer with metal dopants disposed therein. The resist layer may be a polymer resist. The metal dopants may be one or a combination of tin (Sn), titanium (Ti), zirconium (Zr), hafnium (Hf), indium (In), or zinc (Zn). The metal dopants are formed as nanoparticles within the resist layer 310. The use of metal nanoparticle dopants allows improved results of subsequent field guided bake operations. The size of each metal nanoparticle is less than about 25 nm wide, such as less than about 20 nm wide, such as less than about 15 nm wide, such as less than about 10 nm wide. The small size of each metal nanoparticle assists in enabling better resolution during exposure and post exposure bake operations. Other metal nanoparticle compositions are also envisioned, but not disclosed herein.

The resist layer component of the metal containing resist layer 310 includes one or more additives, such as acid agents, (e.g., photoacid generators (PAGs) or acid catalysts), base agents, adhesion promoters or photo-sensitive components. The one or more additives may be deposited in organic solvent or resin and/or an inorganic matrix material. Suitable examples of the acid agents including photoacid generators (PAGs) and/or acid catalysts may be selected from a group consisting of sulfonic acids (e.g., p-toluenesulfonic acid, styrene sulfonic acid), sulfonates (e.g., pyridinium p-toluenesulfonate, pyridinium trilluoromethanesulfonate, pyridinium 3-nitrobenzensulfonate), and mixtures thereof. Suitable organic solvent may include homo-polymers or higher polymers containing two or more repeating units and polymeric backbone. Suitable examples of the organic solvent include, but are not limited to, propylene glycol methyl ether acetate (PGMEA), ethyl lactate (EL), propylene glycol methyl ether (PGME), propylene glycol n-propyl ether (PnP), cyclohexanone, acetone, gamma butyrolactone (GBL), and mixtures thereof. The resist layer may also be deposited using one of a chemical vapor deposition (CVD), physical vapor deposition (PVD), or atomic layer deposition (ALD) operations. The resist layer may also be formed by one of the CVD, PVD, or ALD operations and is similar in composition to the previously described resist layer.

In embodiments in which the metal containing resist layer 310 is deposited using CVD or ALD during the operation 402 of method 400, the metal nanoparticles are deposited by introducing a first precursor which contains the metal nanoparticles and one or more second precursors which form the photoresist material. The precursor streams of the first precursor and the second precursors may mix to form a metal doped resist layer. The mixing of the first precursor and the second precursor is performed concurrently with the deposition of the metal containing resist layer 310. In embodiments wherein the metal nanoparticles are deposited as a part of the metal containing resist layer 310 along with a polymer resist, the metal nanoparticles within the metal containing resist layer 310 have a percent composition of the metal containing resist layer 310 of about 5% to about 30%, such as about 10% to about 25%, such as about 15% to about 25%.

The proposed process conditions utilized during the method 400 are utilized in embodiments with either of the metal oxide resist layer or the metal doped resist layer. Therefore, similar exposure and bake operations may be performed with either of the metal oxide resist layer or the metal doped resist layer embodiments described herein.

Figure 3C:
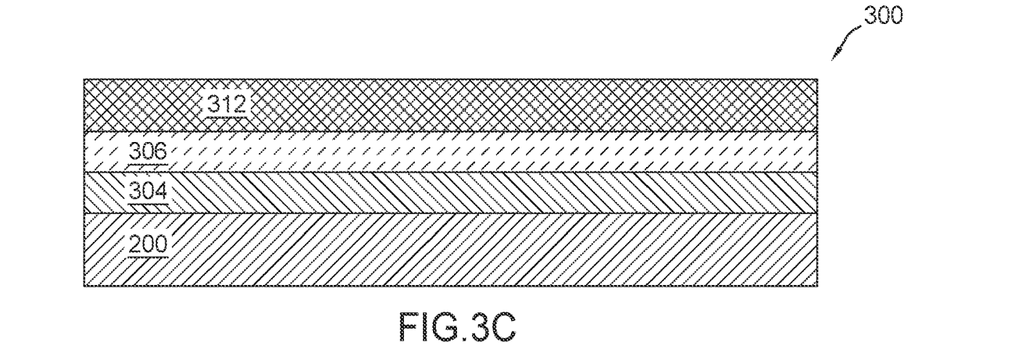

At operation 404, the film stack 300 having the metal containing resist layer 310 deposited thereon undergoes a bake operation 404, as illustrated in FIG. 3C. Baking the film stack 300 includes heating the metal containing resist layer 310 to a temperature of about 80° C. to about _300° C., such as about 80° C. to about 250° C., such as about 100° C. to about 250° C. The baking of the film stack 300 is performed in either the same or a different process chamber than the forming of the metal containing resist layer 310. The baking of the film stack 300 cures the metal containing resist layer 310 to form a baked metal containing resist layer 312 from the metal containing resist layer 310. The baked metal containing resist layer 312 is a solid layer and is rigid.

Figure 3D:
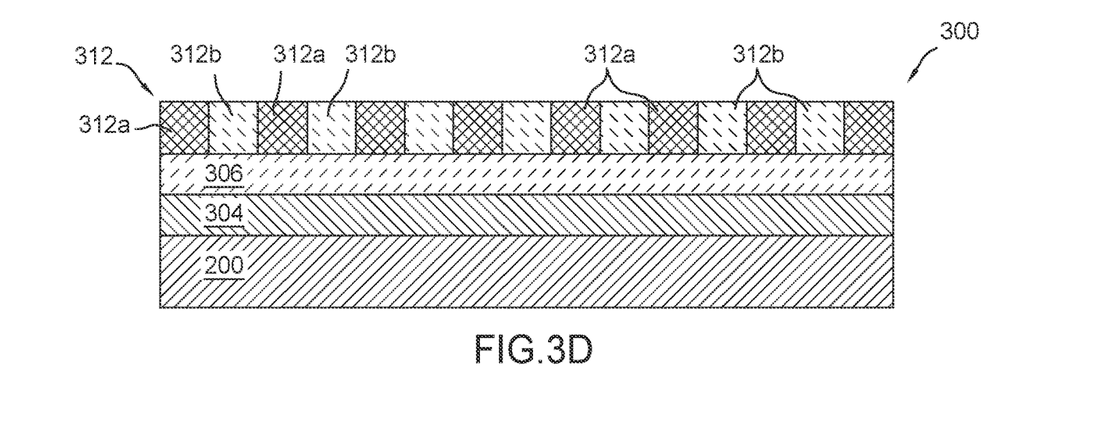

At operation 406, the baked metal containing resist layer 312 deposited on the film stack 300 is exposed, as illustrated in FIG. 3D. The exposure operation 406 is performed within a lithographic processing chamber, which may be one of the chambers 130c-d, or other suitable chamber. The film stack 300 is exposed to radiation to pattern the baked metal containing resist layer 312. Patterning the baked metal containing resist layer 312 includes forming a plurality of unexposed portions 312a and a plurality of exposed portions 312b from the baked metal containing resist layer 312. The unexposed portions 312a are not exposed to the radiation and therefore remain substantially the same as the baked metal containing resist layer 312. The exposed portions 312b are exposed to radiation at a frequency and intensity which disassociates the metal oxide nanoparticles from the ligands. The disassociation of the metal oxide nanoparticles and the ligands forms separated Lewis acids from the metal oxide and Lewis bases from the ligands. The exposed portions 312b may be further cross-linked by the exposure to the radiation. Therefore the physical and chemical properties of the exposed portions 312b changes to be different from the unexposed portions 312a. As described herein, the baked metal containing resist layer 312 is a positive resist layer. However, in some embodiments, exposing portions of the baked metal containing resist layer 312 to radiation may undo crosslinking within the exposed portions 312b and the baked metal containing resist layer 312 serves as a negative resist layer.

The exposure operation 406 includes exposing the exposed portions 312b to a radiation, such as a UV light radiation. In embodiments described herein, the plurality of exposed portions 312b are exposed to a radiation with a wavelength of about 5 nm to about 400 nm, such as about 5 nm to about 20 nm, such as about 10 nm to about 14 nm. The UV light radiation is an extreme ultraviolet light (EUV light). The Extreme ultraviolet light enables the disassociation of the metal oxide and the ligands within the exposed portions 312b.

Figure 3E:
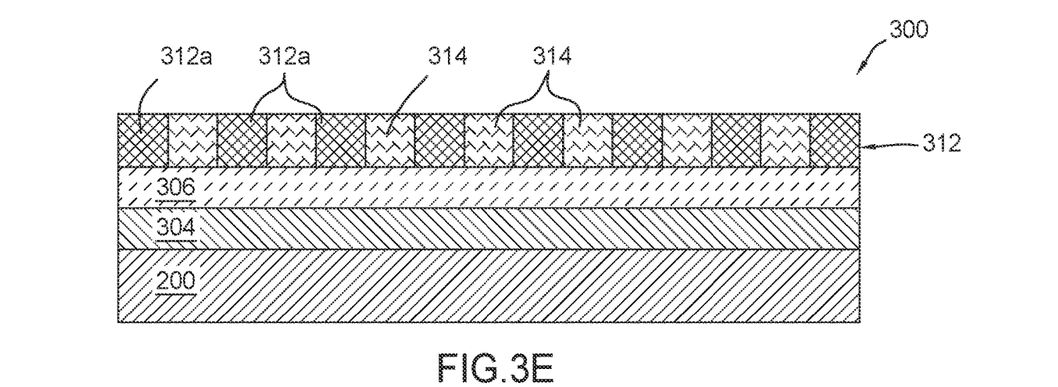

After operation 406, the exposed film stack 300 undergoes a post exposure field guided bake operation 408, as illustrated in FIG. 3E. The post exposure field guided bake operation 408 may be performed in a processing chamber similar to the process chamber 130a shown in FIG. 2, or other suitable process chamber. The post exposure field guided bake operation 408 includes heating the film stack 300 and applying an electric field across the film stack and the baked metal containing resist layer 312, such that the electric field interacts with the plurality of unexposed portions 312a and the plurality of exposed portions 312b of the baked metal containing resist layer 312. The electric field interacts with the Lewis acid and Lewis bases formed by the disassociated metal oxide and ligands as well as any additional ions disposed within the baked metal containing resist layer 312. The electric field may crosslink the metal oxide nanoparticles and the ligands within the exposed portions 312b. The electric field is applied between the electrode 258 and the first surface 234 of the substrate support assembly 238.

As the post exposure field guided bake operation 408 is performed, the distribution and drift of the ligands and other ions within the baked metal containing resist layer 312 are controlled by the electric field. The electric field is oriented roughly perpendicular to the top surface of the film stack 300, such as roughly perpendicular to the top surface 308 of the underlayer 306 of the substrate 200. The electric field may also be described as being oriented perpendicular to or normal to a major plane of the substrate. The major plane of the substrate may be referred to as a wafer plane. The major plane is oriented along the diameter of the substrate 200. The major plane may be perpendicular to the top surface 308 of the underlayer 306 or the top surface of the film stack 300. The major plane is oriented along the length of the substrate. The electric field controls the direction of the reaction of the metal oxide and ligands to prevent diffusion of the disassociated metal oxide and ligands into the unexposed portions 312a. During the post exposure field guided bake operation 408 the exposed portions 312b are converted to a plurality of post bake exposed portions 314. The post bake exposed portions 314 have greater crosslinking and the movement of charged particles parallel to the electric field within the baked metal containing resist layer 312 during the post exposure field guided bake operation 408 reduces line edge roughness. The electric field therefore assists in improving the photoresist line edge roughness, the line critical dimension uniformity, and the dose sensitivity.

In some embodiments the electric field may be controlled to be oriented in a different direction, such as parallel to the top surface 308 of the underlayer 306 or parallel to the major plane. The electric field has a strength of about 100 MV/m to about 2000 MV/m across the film stack 300. The electric field is caused by a voltage differential of about 0V to about 4000 V between the electrode 258 and the first surface 234 of the substrate support assembly 238, such as about 10 V to about 4000 V, such as about 100 V to about 4000 V. A current may alternatively be flown through the electrode 258, such that a current of about 10 µA to about 1 A.

During the post exposure field guided bake operation 408, the substrate 200 and the film stack 300 are heated to a temperature of about 100° C. to about 300° C., such as a temperature of about 100° C. to about 250° C., such as a temperature of about 150° C. to about 250° C., such as a temperature of about 175° C. to about 250° C. Performing the field guided bake operation 408 at temperatures above 100° C. results in improved stochastics and cross linking within the exposed portions 312b. As the temperature increases towards about 250° C., such as about 150° C. during the post exposure field guided bake operation 408, the mobility of the disassociated ligands and other charged ions is increased within the exposed portions 312b. The post exposure field guided bake operation 408 is further performed at a pressure of about 100 mTorr to about 800 Torr, such as about 100 mTorr to about 760 Torr, such as about 1 Torr to about 600 Torr.

The post exposure field guided bake operation 408 may be either a dry or wet process. In examples wherein the post exposure field guided bake operation 408 is a dry process, the medium within the process volume 212 is a gas. The gas may be an inert gas, such as one or a combination of argon (Ar), Helium (He), Xenon (XE), Neon (He), Nitrogen (N$_2$), or ambient air. In some embodiments, the process volume 212 is under vacuum and no gases are flowed into the process volume 212 during the post exposure field guided bake operation 408. In other embodiments, the gas includes carbon dioxide (CO$_2$), oxygen (O$_2$), or steam (H$_2$O). The steam is kept in a vapor state and does not condense at the temperatures and pressures within the process chamber 130a. In examples wherein the post exposure field guided bake operation 408 is a wet process, the medium within the process volume is a liquid or a slurry. Possible mediums include carbon-based liquids or deionized liquid water.

Figure 3F:
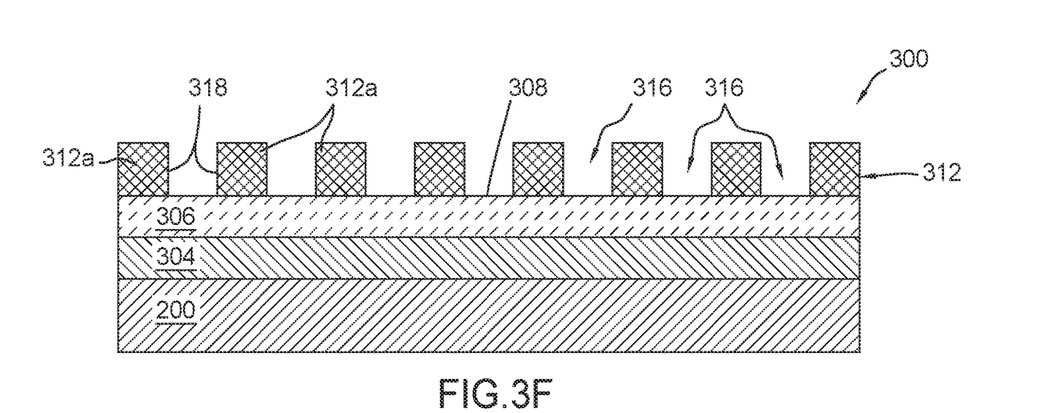

At a development operation 410, the film stack 300 undergoes a wet development or a dry development process as shown in FIG. 3F. Optionally, the development operation 410 may also include an area-selective ALD process. The area-selective ALD process may be used to deposit a layer selectively over one of the unexposed portions 312a or the exposed portions 312b. The area-selective ALD may deposit a separate hardmask layer over the baked metal containing resist layer 312. The area-selective ALD is selectively deposited as the surface properties of each of the unexposed portions 312a and the exposed portions 312b are different.

Specifically, FIG. 3F illustrates the film stack after development of the film stack 300. The development is configured to remove either the unexposed portions 312a or the exposed portions 312b. Which of the unexposed portions 312b or the exposed portions 312b is removed depends at least partially on whether the development process is configured to be a positive or a negative development process. In the positive development process, the post bake exposed portions 314 are removed to leave behind the unexposed portions 312f as shown in FIG. 3F. In the negative development process, the post bake exposed portions 314 are left behind, while the unexposed portions are removed (not shown). The baked metal containing resist layer 312 is treated using a wet or a dry etch. The wet or dry etch is performed in a separate chamber from the process chamber 130a in which the post exposure field guided bake operations 408 are performed. As shown herein, the etch is performed to remove at least a portion of the post bake exposed portions 314 and form a plurality of openings 316 between each of the unexposed portions 312a. Therefore, the sidewalls 318 of each of the unexposed portions 312a are exposed and form the openings 316 within the baked metal containing resist layer 312. When the post bake exposed portions 314 are completely removed, the top surface 308 of the underlayer 306 is exposed to form a bottom surface of the openings 316. Alternatively, the wet or dry development may remove the unexposed portions 312a of the baked metal containing resist layer 312.

The dry development may be an anisotropic etching process, such as a selective etch process. The film stack 300 may be exposed to a plasma or other thermal process to remove the unexposed portions 312a or the post bake exposed portions 314.

The wet development may include applying a solvent or other liquid configured to remove one of the post bake exposed portions 314 or the unexposed portions 312a. The solvent removes at least a portion of one of the post bake exposed portions 314 or the unexposed portions 312a.

The area-selective ALD is not shown in FIG. 3F, but may be performed when it is desired to form an area-selective hard mask. The area-selective ALD is performed to deposit a metal or a metal oxide selectively on one of the post bake exposed portions 314 or the unexposed portions 312a. The area-selective ALD only deposits the metal or metal oxide on one of the post bake exposed portions 314 or the unexposed portions 312a and is therefore selective to areas of the baked metal containing resist layer 312 with predetermined surface qualities.

After the development operation 410 is performed, an optional post development field guided bake or anneal, such as the post development field guided bake/anneal process, is performed at operation 412. The optional post development field guided bake or anneal is performed to improve the edge smoothness and enhance the material properties of the remaining portions of the baked metal containing resist layer 312 by improving cross linking within the baked metal containing resist layer 312. The post development field guided bake operation 412 may be performed using similar process conditions as described for the post exposure field guided bake operation 408. The temperature during the post development field guided bake operation 412 is about 100° C. to about 300° C., such as about 100° C. to about 250° C., such as a temperature of about 150° C. to about 250° C., such as a temperature of about 175° C. to about 250° C. The pressure during the post development field guided bake operation 412 is about 100 mTorr to about 800 Torr, such as about 100 mTorr to about 760 Torr, such as about 100 mTorr to about 600 Torr.

In some embodiments, either one or both of the post exposure field guided bake operation 408 and the post development field guided bake/anneal operation 412 are performed at a supra-atmospheric pressure. The supra-atmospheric pressure is about 760 Torr to about 1500 Torr, such as about 760 Torr to about 1200 Torr. The supra-atmospheric pressure has been shown to improve cross linking and reduce bake times. Therefore, in some embodiments the pressure during the post exposure field guided bake operation 408 and/or the post development field guided bake/anneal operation 412 is about 100 mTorr to about 1200 Torr.

An electric field is applied to the film stack 300 during the post development field guided bake/anneal operation 412 is similar to the electric field applied during the post exposure field guided bake operation 408. The electric field has a strength of about 100 MV/m to about 2000 MV/m across the film stack 300 during the post development field guided bake/anneal operations 412, 512. The electric field is produced by a voltage differential of about 0V to about 4000 V between the electrode 258 and the first surface 234 of the substrate support assembly 238, such as about 10 V to about 4000 V, such as about 100 V to about 4000 V. A current may alternatively be flowed through the electrode 258, such that a current of about 10 µA to about 1 A.

The post development field guided bake operation 412 may be either dry or wet processes. In operations wherein the post development field guided bake operation 412 is a dry process, the medium within the process volume 212 is a gas. The gas may be an inert gas, such as one or a combination of argon (Ar), Helium (He), Xenon (XE), or Neon (He). In other embodiments, the gas includes oxygen ($O_2$) or steam ($H_2O$). In operations wherein the post development field guided bake operation 412 is a wet process, the medium within the process volume is a liquid or a slurry. Possible mediums include fluorocarbon based liquids or hydrocarbon based fluids, such as oil. Deionized liquid water may also act as the medium.

Figure 3G:
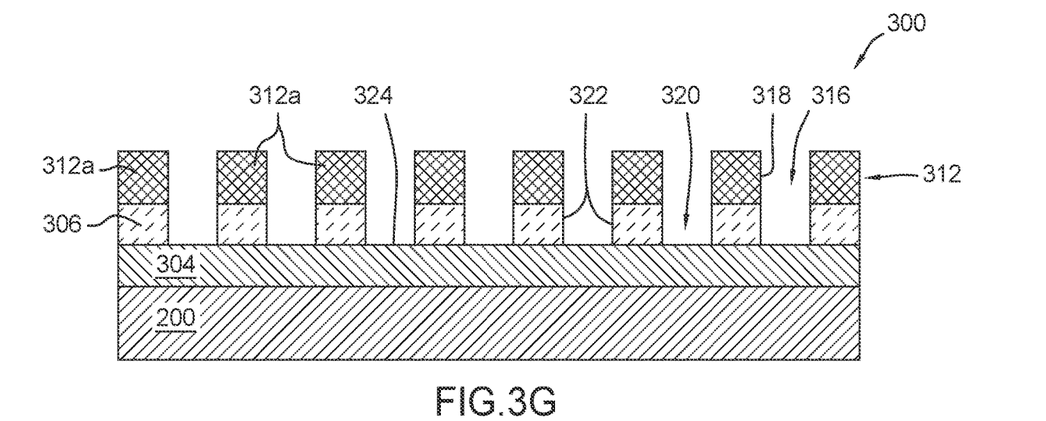

After the development 410, and optionally after the second post development field guided bake operation 412, an etch operation 414 is performed, as illustrated by FIG. 3G. The etch operation 414 includes etching at least a portion of the underlayer 306 through the opening 316 in the baked metal containing resist layer 312. The etch operation 414 may be any suitable dry or wet etch process. Etching the underlayer 306 forms a plurality of underlayer openings 320 formed through the underlayer 306. Each of the underlayer openings 320 have sidewalls 322 and a bottom which is formed by the top surface 324 of the device layer 304.

Drying or cleaning operations (not shown) may also be performed either during or subsequent to the method 400 described herein. The drying or cleaning operations may include any suitable drying or cleaning process.

Methods described herein enable improved dose sensitivity and reduced line width roughness when using metal containing resist layers. The field guided post exposure bake process influences the drift of ions and charged particles within the metal containing resist layer. By improving patterning resist sensitivity, line width roughness, and line edge roughness, smaller and more uniform features are enabled on the film stack 300. Therefore, small line widths may be utilized while reducing the impact of line width roughness on device yields.

While the foregoing is directed to embodiments of the present disclosure, other and further embodiments of the disclosure may be devised without departing from the basic scope thereof, and the scope thereof is determined by the claims that follow.

What is claimed is:

1. A method of processing a film stack, comprising:
forming a metal containing resist layer on a substrate, wherein the metal containing resist layer is one of a metal doped resist layer or a metal oxide resist layer, wherein the metal containing resist layer comprises:
a photoresist layer; and
metal nanoparticles disposed within the photoresist layer, wherein the size of each metal nanoparticle is less than about 25 nm wide;
patterning the metal containing resist layer to form a plurality of unexposed portions of the metal containing resist layer and a plurality of exposed portions of the metal containing resist layer; and
performing a post exposure bake process after patterning the metal containing resist layer, wherein an electric field, produced by a voltage differential of about 100V to about 4000V between a substrate support and an electrode, is applied through an inert gas in contact with and across the metal containing resist layer and perpendicular to a major plane of the substrate to treat the plurality of exposed portions of the metal containing resist layer.

2. The method of claim 1, wherein the forming the metal containing resist layer on the substrate comprises depositing the metal containing resist layer by spin coating, CVD, or ALD and further comprising:
baking the metal containing resist layer before patterning the metal containing resist layer; and
developing the metal containing resist layer using a wet or dry development process after performing the post exposure bake process.

3. The method of claim 1, wherein the substrate comprises:
a device layer deposited on top of the substrate; and
an underlayer deposited on top of the device layer and below the metal containing resist layer.

4. The method of claim 1, wherein the metal containing resist layer is the metal oxide resist layer and comprises:
the metal nanoparticles comprising metal oxide nanoparticles; and
ligands bonded to the metal oxide nanoparticles.

5. The method of claim 4, wherein the metal containing resist layer comprises one or a combination of tin (IV) oxide, titanium dioxide, zirconium dioxide, hafnium dioxide, indium (III) oxide, and zinc oxide.

6. The method of claim 1, wherein the metal nanoparticles of the metal containing resist layer have a percent composition of the metal containing resist layer of about 5% to about 30%.

7. The method of claim 6, wherein the metal containing resist layer comprises one or a combination of tin, titanium, zirconium, hafnium, indium, or zinc.

8. The method of claim 1, wherein the post exposure bake process is performed at a temperature of about 100° C. to about 300° C.

9. The method of claim 8, wherein the post exposure bake process is performed at a pressure of about 100 mTorr to about 1200 Torr.

10. A method of processing a film stack, comprising:
forming a metal containing resist layer on a substrate, the metal containing resist layer comprising metal nanoparticles or metal oxide nanoparticles less than about 25 nm wide;
patterning the metal containing resist layer to form a plurality of unexposed portions of the metal containing resist layer and a plurality of exposed portions of the metal containing resist layer; and
performing a post exposure bake process after patterning the metal containing resist layer by heating the substrate to about 150° C. to about 300° C. and applying a first electric field across the metal containing resist layer, wherein the electric field is produced by a voltage differential of about 100V to about 4000V between a substrate support and an electrode and is applied through an inert gas in contact with and across the metal containing resist layer, and perpendicular to a major plane of the substrate to treat the plurality of unexposed portions of the metal containing resist layer.

11. The method of claim 10, further comprising:
baking the metal containing resist layer before patterning the metal containing resist layer; and
developing the metal containing resist layer using a wet or dry development process after performing the post exposure bake process.

12. The method of claim 11, further comprising:
heating the substrate to about 150° C. to about 250° C. and applying a second electric field across the metal containing resist layer perpendicular to the major plane of the substrate after developing the metal containing resist layer.

13. The method of claim 11, wherein developing the substrate comprises etching at least a portion of the plurality of exposed portions of the metal containing resist layer.

14. The method of claim 10, wherein performing the post exposure bake process further comprises:
maintaining a volume in which the substrate is processed at a pressure of between about 100 mTorr and about 1200 Torr.

15. The method of claim 10, wherein the forming the metal containing resist layer on the substrate further comprises:
spin coating the metal containing resist layer on the substrate.

16. The method of claim 10, wherein the forming the metal containing resist layer on the substrate further comprises:
depositing the metal containing resist layer by a chemical vapor deposition process or an atomic layer deposition process.

17. A method of processing a substrate, comprising:
forming a metal containing resist layer on a substrate, the metal containing resist layer comprising metal oxide nanoparticles or metal nanoparticles, wherein the metal oxide nanoparticles or metal nanoparticles are disposed in the metal containing resist layer and are less than about 25 nm wide;
baking the metal containing resist layer;
patterning the baked metal containing resist layer to form a plurality of unexposed portions of the metal containing resist layer and a plurality of exposed portions of the metal containing resist layer;
performing a post exposure bake process after patterning the metal containing resist layer by heating the substrate to about 80° C. to about 300° C., and applying a first electric field across the metal oxide resist layer perpendicular to a major plane of the substrate, wherein the electric field is produced by a voltage differential of about 100V to about 4000V between a substrate support and an electrode and is applied through an inert gas in contact with and across the metal containing resist layer to treat the plurality of unexposed portions of the metal containing resist layer;
developing the substrate using a wet or dry development process after performing the post exposure bake process; and
performing a post development bake after developing the substrate by heating the substrate and applying a second electric field across the metal containing resist layer perpendicular to a major plane of the substrate.

18. The method of claim 17, wherein developing the substrate comprises:
removing at least a portion of the plurality of exposed portions of the metal containing resist layer.

19. The method of claim 17, wherein developing the substrate further comprises:
performing an area-selective atomic layer deposition process.

20. The method of claim 17, wherein patterning the metal containing resist layer further comprises:
   exposing the exposed portions of the metal containing resist layer to a radiation with a wavelength of about 5 nm to about 20 nm.

21. The method of claim 1, wherein a current flows from the electrode to the substrate support during the post exposure bake process, the current being between about 10 µA to about 1 A.

22. The method of claim 1, further comprising performing a wet development process after the post exposure bake process.

* * * * *